(12) United States Patent
Slessman

(10) Patent No.: US 8,039,997 B2
(45) Date of Patent: Oct. 18, 2011

(54) POWER SUPPLY STRIP FOR ELECTRONIC EQUIPMENT

(75) Inventor: George Slessman, Scottsdale, AZ (US)

(73) Assignee: Thermocabinet, LLC, Scottsdale, AZ (US)

( * ) Notice: Subject to any disclaimer, the term of this patent is extended or adjusted under 35 U.S.C. 154(b) by 188 days.

(21) Appl. No.: 12/365,675

(22) Filed: Feb. 4, 2009

(65) Prior Publication Data

US 2010/0194194 A1    Aug. 5, 2010

(51) Int. Cl.
*H02J 3/00* (2006.01)

(52) U.S. Cl. .................. 307/147; 307/17; 307/42

(58) Field of Classification Search .......... 307/17, 307/42, 147; 439/86, 90, 110, 121; 174/99 R, 174/99 B; 361/648, 650, 637, 640, 826
See application file for complete search history.

(56) References Cited

U.S. PATENT DOCUMENTS

| | | | | |
|---|---|---|---|---|
| 3,124,403 | A * | 3/1964 | Rowe | 439/212 |
| 3,835,442 | A * | 9/1974 | Anderson et al. | 439/86 |
| 5,126,514 | A | 6/1992 | Bommart | |
| 6,628,009 | B1 * | 9/2003 | Chapel | 307/14 |
| 6,972,375 | B2 * | 12/2005 | Sugaya et al. | 174/117 F |
| 2003/0033364 | A1 | 2/2003 | Garnett et al. | |
| 2005/0211835 | A1 * | 9/2005 | Henley et al. | 244/118.6 |
| 2006/0044766 | A1 | 3/2006 | Hartel et al. | |
| 2006/0146581 | A1 | 7/2006 | Murphy | |
| 2007/0281526 | A9 | 12/2007 | Donahue, IV | |
| 2009/0236909 | A1 | 9/2009 | Aldag et al. | |

* cited by examiner

*Primary Examiner* — Fritz M Fleming
(74) *Attorney, Agent, or Firm* — Proskauer Rose LLP

(57) ABSTRACT

A power supply strip for electronic equipment including a power supply cable for connection to a power source, a housing connected to the power supply cable, and a plurality of conductor rails located within the housing. One or more power receptacle modules is insertable into the housing, each comprising at least one power receptacle. Each power receptacle module is connectable to selected conductor rails such that the or each power receptacle is configurable to provide a desired power supply configuration. With a three-phase power supply, the rails can be selectable between A-phase, B-phase, C-phase, Neutral and Ground.

19 Claims, 5 Drawing Sheets

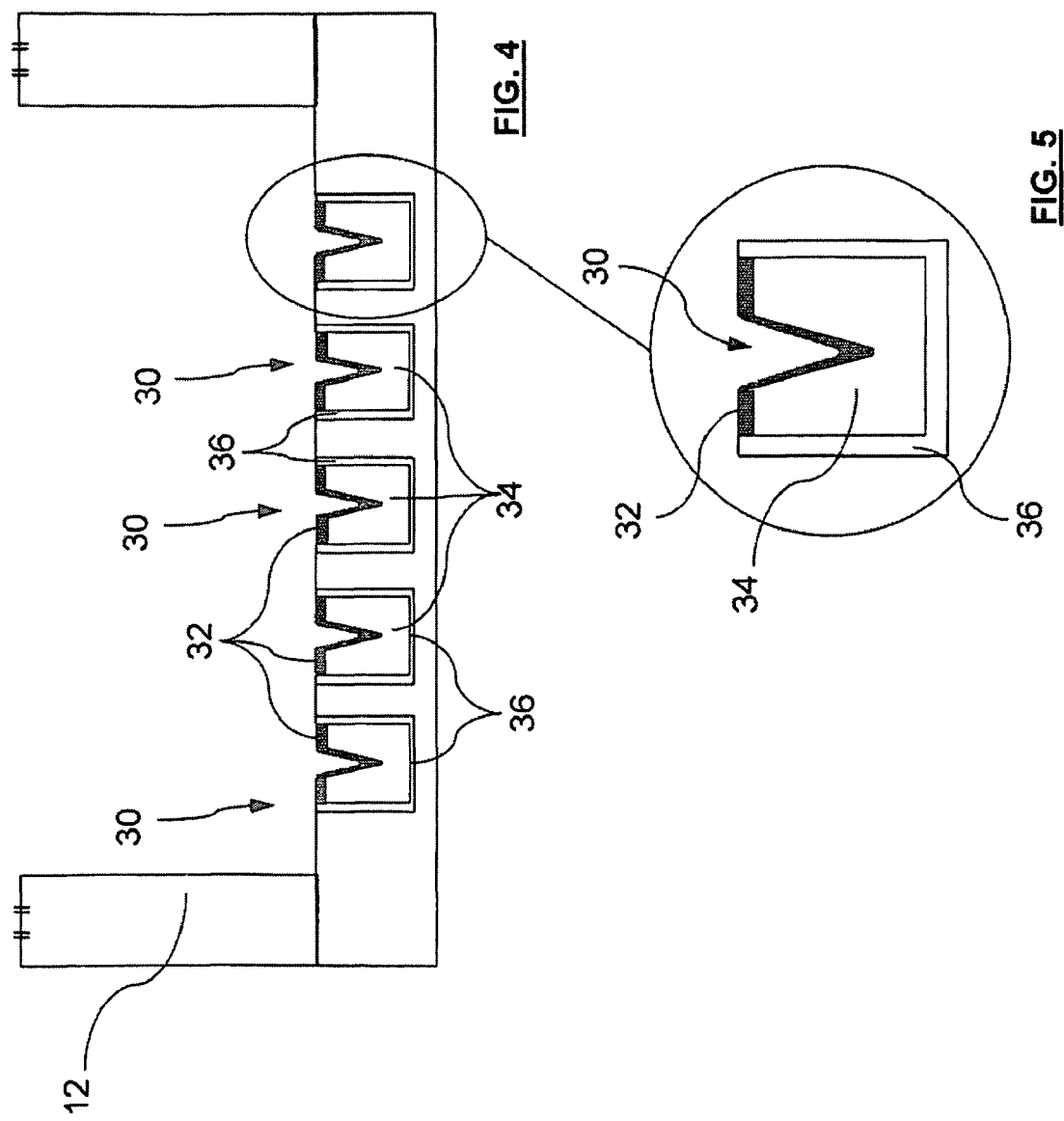

POWER SUPPLY STRIP FOR ELECTRONIC EQUIPMENT

FIELD OF THE INVENTION

The present application relates to power supply strips for electronic equipment, and particularly to a power supply system for use with servers and other computing equipment.

BACKGROUND

Data centers typically involve a large number of rack-mounted servers that are housed together in cabinets. Recent increases in processor speeds and reductions in the size of processors have meant that more processing power is provided by each server within a cabinet, and consequently the amount of power required to operate the server cabinets has increased dramatically. Additionally, power is typically needed for fans and other cooling equipment, due to the large amount of heat generated by the processors. A typical server cabinet in a data center contains 42 1U dual-power supply servers in each cabinet. Power demands for such a cabinet far exceed typical single-phase 120V 20 A power circuits, and thus three-phase power circuits must be used.

A problem arises when designing power supplies for server cabinets because the rated amperages of servers do not correlate with the amount of power that the device typically consumes. As an example, a device that is rated as 220 A, 220V and thus requires a power supply of 440 kW will typically not draw more than 2 kW. Most servers, and hence the cabinets that they are stacked within thus have a significantly overweighted power supply because the data center must dedicate the rated amount to the circuit.

It is desirable to be able to move the overweighting of the power supply circuit from each individual server to the cabinet itself. In this way, the distribution of power within the cabinet can be managed appropriately.

SUMMARY

In accordance with one aspect of the exemplary embodiments, a power supply strip for electronic equipment including a power supply cable for connection to a power source, a housing connected to the power supply cable, and a plurality of conductor rails located within the housing. One or more power receptacle modules is insertable into the housing, each comprising at least one power receptacle. Each power receptacle module is connectable to selected conductor rails such that the or each power receptacle is configurable to provide a desired power supply configuration. With a three-phase power supply, the rails can be selectable between A-phase, B-phase, C-phase, Neutral and Ground.

In one arrangement, the power supply cable is connectable to a three-phase power supply, and wherein five conductor rails are provided. The five conductor rails can be connected respectively to A-phase, B-phase, C-phase, Neutral and Ground. Each power receptacle module can comprise three power receptacles, and wherein the three power receptacles in one module are connectable to the A, N, G conductor rails, to the B, N, G conductor rails, and to the C, N, G conductor rails respectively.

In another arrangement, a plurality of power receptacle modules are provided for insertion into the housing. The at least one power receptacle can be selectable and changeable by the user to provide differing power supplies for different pieces of electronic equipment.

The conductor rails can extend the length of the housing. In some arrangements, the conductor rails can comprise a generally V-shaped valley in a resilient material, the valley comprising coating of a conductive material and the resilient material being surrounded on at least three sides by an insulator. The resilient material may be conductive, and the conductive coating can be copper.

In some arrangements, a plurality of different power supply receptacles can be provided, which are selectable by a user to provide different power outputs. The power supply receptacles can be selected from the group including L5-20, L5-20R, L5-15R, 5-20R, L6-20R, L6-30R and 5-15R receptacles.

In various arrangements, at least one blank expansion module can be provided that is insertable in the housing. The housing can define at least one power module port for receiving a power receptacle module. The power module port and power receptacle module can comprise complementary guide rails to ease insertion of the power receptacle module into the power module port.

The power receptacle module can comprise a plurality of male conductors that are connectable to the selected conductor rails. In some arrangements, wire connectors can be provided, that are attachable between the male conductors of the power receptacle module and the conductor rails. The wire connectors can have connection pins that are a pressure fit into the conductor rails. Alternatively, the male conductors can be a direct pressure fit into the conductor rails.

The housing can be dimensioned so as to be rack mountable within a server cabinet so that the power strip can be used for powering servers and other equipment stored within the cabinet.

The above-described and other features and advantages of the present disclosure will be appreciated and understood by those skilled in the art from the following detailed description, drawings, and appended claims.

BRIEF DESCRIPTION OF THE DRAWINGS

FIG. 4 is an end sectional view of an empty section of the power supply strip of FIG. 1.

FIG. 5 is an expanded close up view of one of the power supply rails shown in FIG. 4.

DETAILED DESCRIPTION OF THE INVENTION

Figure 1:
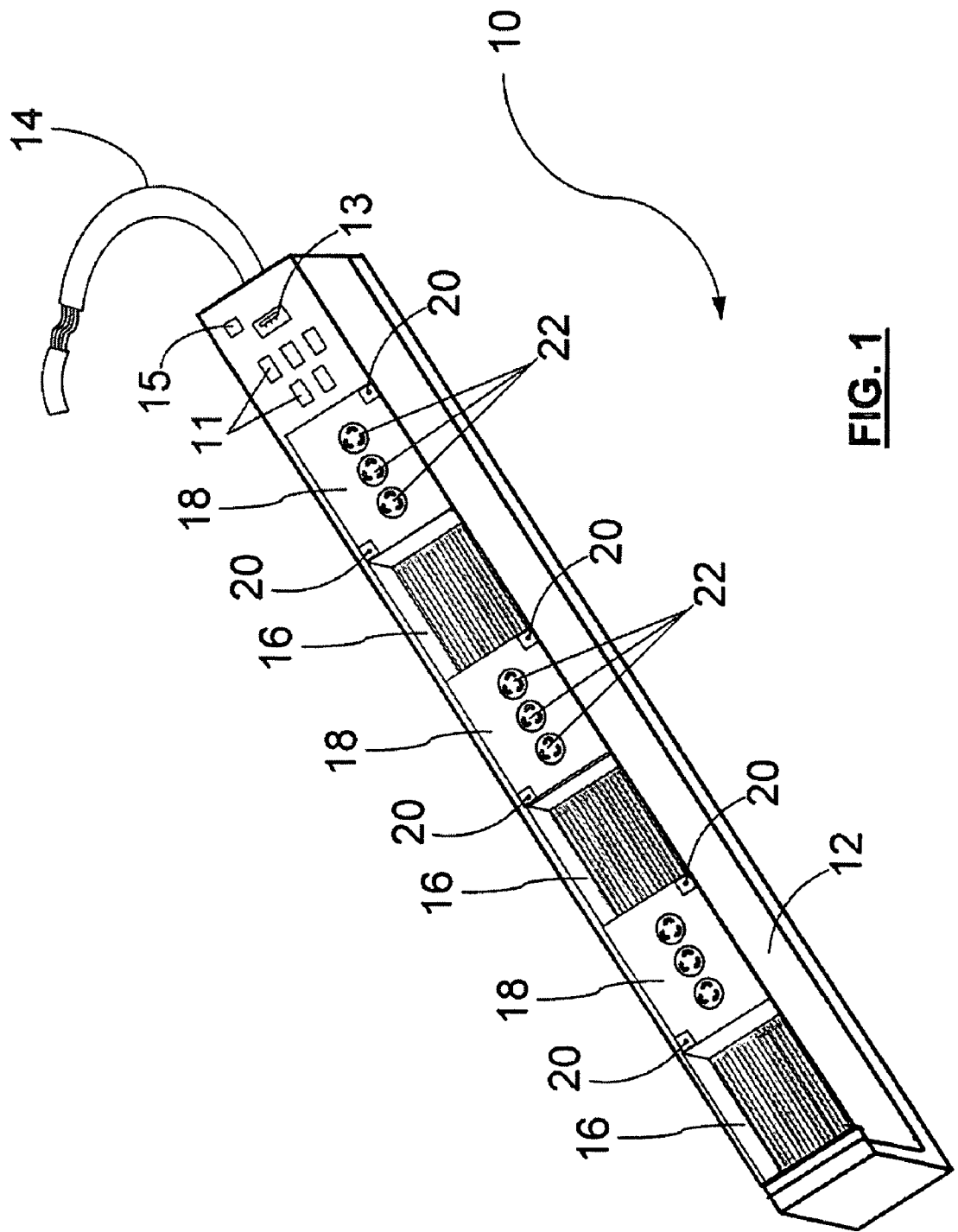
FIG. 1 is a perspective view of a power supply strip according to arrangements of the present invention.

The exemplary embodiments of the present disclosure are described with respect to a power supply strip for electronic equipment. It should be understood by one of ordinary skill in the art that the exemplary embodiments of the present disclosure can be applied to other types of power supply arrangements.

Referring to the drawings, an exemplary power supply strip for electronic equipment is illustrated. The strip 10 comprises a housing 12 connected to an electrical supply cable 14. The housing 12 may be formed with a steel construction, or may be formed of any suitable material. The housing is preferably UL listed and sized to be rack mounted within a server cabinet, although any suitable size and shape may be employed. In certain arrangements, the housing 12 may be 4-5 feet long. The electrical supply cable 14 may be any suitable cable. In one arrangement, the cable may be a 5-wire 200% ground, 200% neutral #10 conductor flexible copper whip capable of carrying a three-phase power supply, and may for example be ¾ in width. Various amperage monitors 11 (typically one each for A, B, C phases, Neutral and Ground), an RJ-45 jack 13 and an optional 3-pole breaker 15 may be provided.

Figures 2, 3:
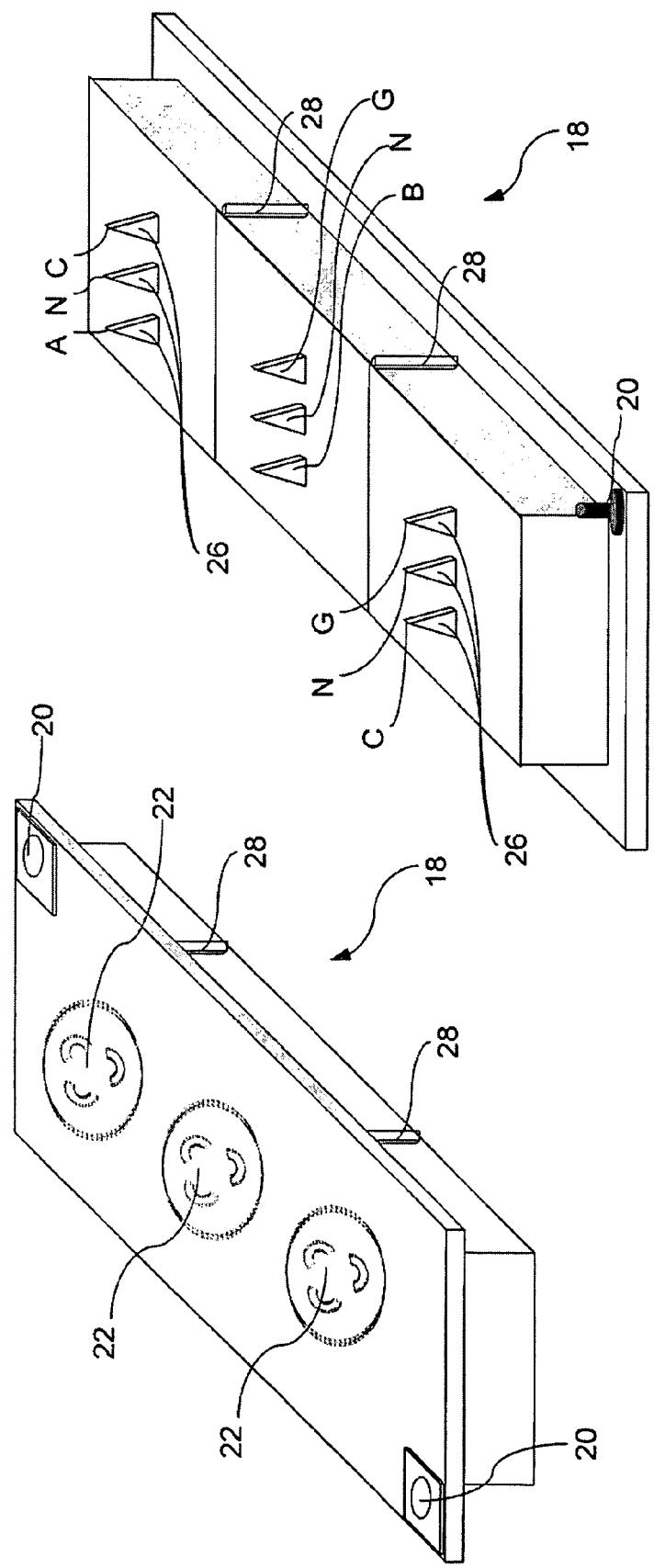
FIG. 2 is a top perspective view of a power module for the power supply strip of FIG. 1.
FIG. 3 is a bottom perspective view of a power module for the power supply strip of FIG. 1.

The housing 12 may be arranged to comprise a plurality of power module ports 16. Each power module port 16 is sized to receive one power module 18, which are illustrated in FIGS. 1-3. Each power module 18 can be sized to fit within a power module port 16 only one way, and may be screwed into place using screws 20 or any other suitable connection mechanism. Each power module 18 may have three three-prong receptacles 22, although of course any suitable socket or receptacle arrangement may be used. In one arrangement, the receptacles 22 can be L5-20 receptacles. Available receptacles for each power module 18 may include L5-20R, L5-15R, 5-20R, L6-20R, L6-30R and 5-15R, which may be selectable by the user depending on the particular application. It will be appreciated that any type of receptacle arrangement can be provided for the power strip 10, and that the selection of the particular power receptacle type that is used within each power module 18 may be made by the user to provide differing amp and voltage ratings to different pieces of electronic equipment, depending on the power requirements of that piece of equipment. For example, an L5-15R receptacle can provide 15 Amps, while an L6-30R receptacle can provide 30 Amps. All three receptacles 22 on one power module 18 may be the same type of receptacle, or they may be different receptacles. The power modules 18 may be supplied pre-wired with selected power receptacle types, and the user may simply select different power modules 18 that are appropriate for their requirements. Alternatively, the user may select the individual receptacles 22. If the user does not need as many power modules 18 as there are power module ports 16, one or more blank expansion modules (not shown) may be used to cover the power module port 16. The blank expansion modules may simply be plates or may be the same general shape and size as the power modules 18.

Underneath the power module 18, three connection pins or male conductors 24 may be provided for each receptacle 22. Typically, with a three-phase power supply, each of the three receptacles 22 on one power module will have a connection pin 26 for a different phase, as well as a connection for neutral and ground. For example, one of the receptacles can have connections for A-phase power, Neutral and Ground, the second receptacle can have connections for B-phase power, Neutral and Ground, and the third receptacle can have connections for C-phase power, Neutral and Ground. Guide rails 28 may be provided to help place the power module 18 within the power module port 16 of the housing 12.

Referring now to FIGS. 4 and 5, an end sectional view through the housing 12 is shown. Five conductor rails or raceways 30 are supplied in the bottom of the housing 12, and run the entire length of the housing 12. Each conductor rail 30 is connected to one of the A, B, C, N or G phases of the power supply cable 14. Each conductor rail 30 comprises a conductor 32, such as copper, arranged on the surface of a generally V-shaped valley in a resilient conductive material 34. The rail 30 is surrounded (apart from the surface covered by the conductor 32) by an insulator 36. It will be appreciated that the conductor 32, resilient material 34 and insulator 36 may each be formed of any suitable material.

Figure 6:
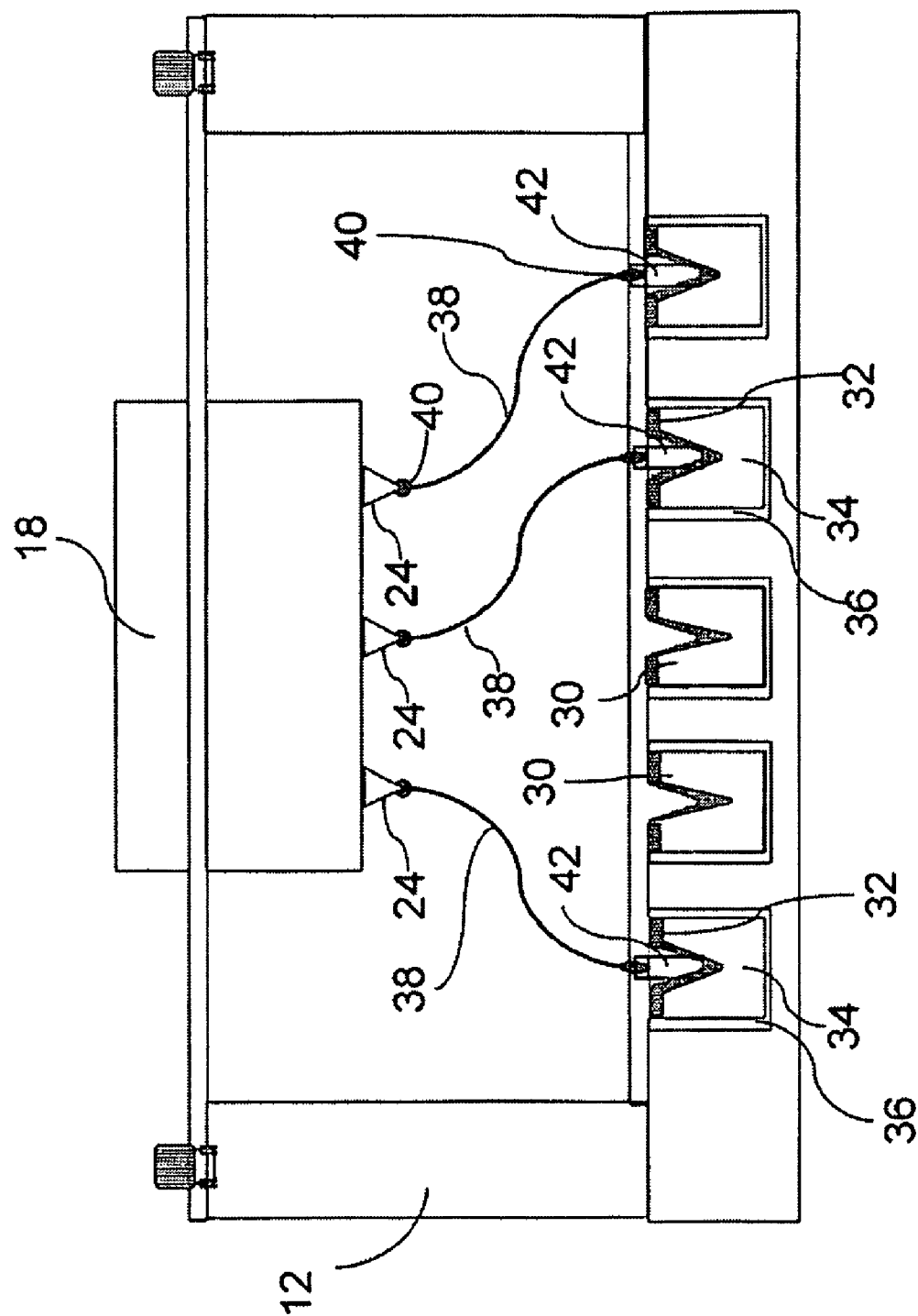
FIG. 6 is an end sectional view of a section of the power supply strip of FIG. 1, with a power module inserted therein.
Figure 7:
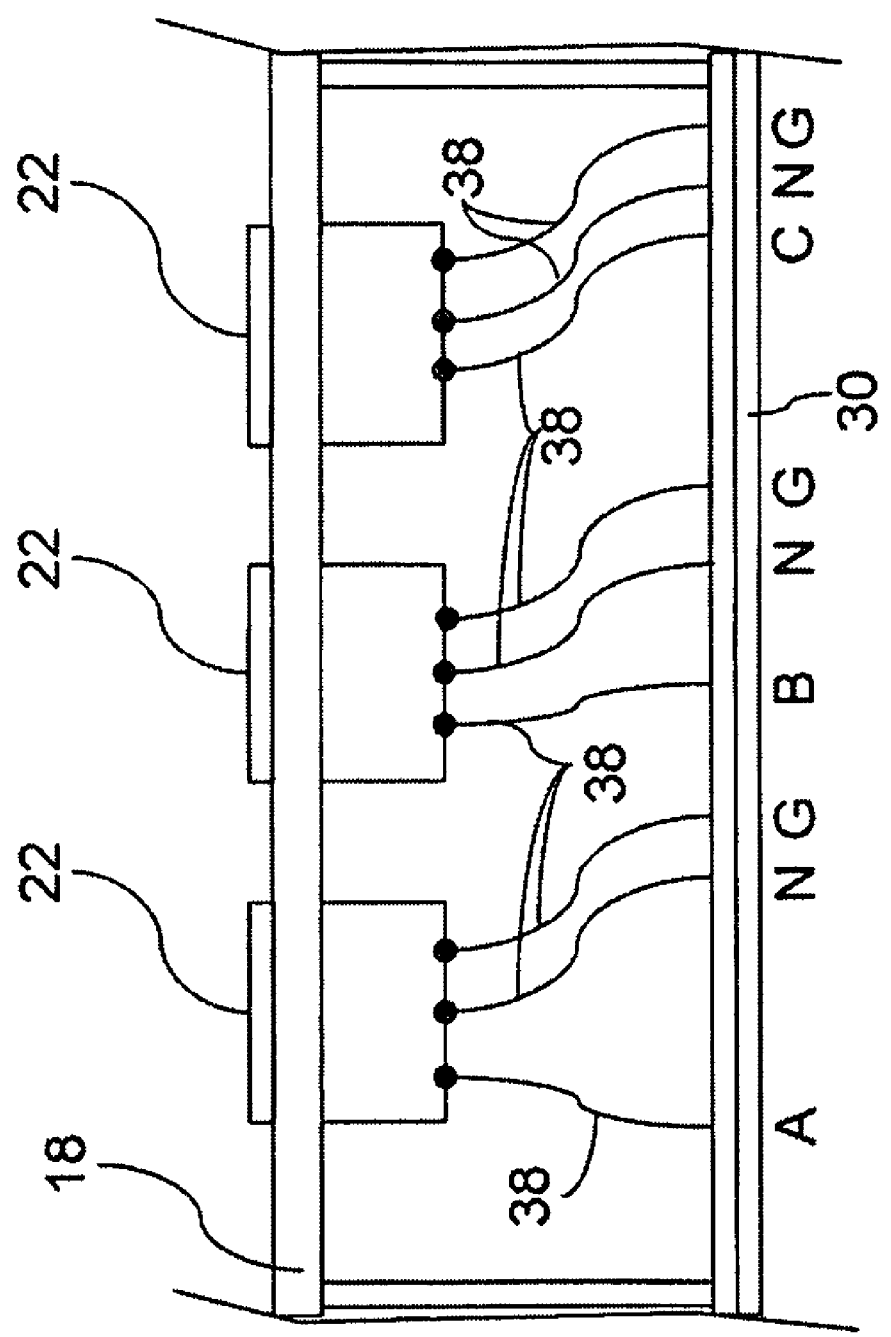
FIG. 7 is a side sectional view of a section of the power supply strip of FIG. 1, with a power module inserted therein.

When one or more power modules 18 are connected into the housing 12, as shown in FIGS. 6 and 7, wire conductors 38 can be soldered 40 or otherwise connected between the connection pins 24 and connection pins 42 that are inserted into the rails 30. The resilient material 34 in the rails 30 holds the connection pins 42 under tension in a pressure fit arrangement. In this way, the relevant A, B, C, N or G phase pin receptacle of each receptacle 22 of the power module 18 may be connected to the relevant power supply line. In an alternative arrangement (not shown), the connection pins 24 on the power module 18 can be arranged to fit directly in the rails 30, in a pressure fit arrangement. In this arrangement, each connection pin 24 is placed at an appropriate location to align with a chosen rail 30 when the power module 18 is pushed into the housing 12. This removes the need to use wire conductors 38.

The power strip 10 of the present invention enables a user to match the power receptacle 22 or receptacle to the power supply needs of the individual piece of electronic equipment being supplied. This means that the user can manage the power supply within a cabinet, without the need to supply multiple power circuits to a single cabinet.

The illustrations of arrangements described herein are intended to provide a general understanding of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. A power supply strip for electronic equipment comprising:
   a power supply cable for connection to a power source;
   a housing connected to the power supply cable;
   a plurality of conductor rails located within the housing; and
   one or more power receptacle modules insertable into the housing, each power receptacle module comprising at least one power receptacle, wherein each power receptacle module is connectable to selected conductor rails such that each of the one or more power receptacles is configurable to provide a desired power supply configuration, and wherein the conductor rails comprise a generally V-shaped valley in a conductive resilient material, the valley comprising coating of a conductive material and the conductive resilient material being surrounded on at least three sides by an insulator.

2. The power supply strip according to claim 1, wherein the power supply cable is connectable to a three-phase power supply, and wherein five conductor rails are provided.

3. The power supply strip according to claim 2, wherein the five conductor rails are connected respectively to A-phase, B-phase, C-phase, Neutral and Ground wires in the power supply cable.

4. The power supply strip according to claim 3, wherein each power receptacle module comprises three power receptacles, and wherein the three power receptacles in one module are connectable to the A, N, G conductor rails, to the B, N, G conductor rails, and to the C, N, G conductor rails respectively.

5. The power supply strip according to claim 1, wherein the conductor rails extend the length of the housing.

6. The power supply strip according to claim 1, wherein the conductive coating is copper.

7. The power supply strip according to claim 1, wherein the at least one power supply receptacle is selected from the group consisting of L5-20, L5-20R, L5-15R, 5-20R, L6-20R, L6-30R and 5-15R receptacles.

8. The power supply strip according to claim 1, wherein at least one blank expansion module is provided that is insertable in the housing.

9. The power supply strip according to claim 1, wherein the housing defines at least one power module port for receiving a power receptacle module.

10. The power supply strip according to claim 9, wherein the power module port and power receptacle module comprise complementary guide rails to ease insertion of the power receptacle module into the power module port.

11. The power supply strip according to claim 1, wherein the power receptacle module comprises a plurality of male conductors that are connectable to the selected conductor rails.

12. The power supply strip according to claim 11, wherein wire connectors are provided that are attachable between the male conductors of the power receptacle module and the conductor rails.

13. The power supply strip according to claim 12, wherein the wire connectors have connection pins that are a pressure fit into the conductor rails.

14. The power supply strip according to claim 11, wherein the male conductors are a pressure fit into the conductor rails.

15. The power supply strip according to claim 1, wherein the housing is dimensioned so as to be rack mountable within a server cabinet.

16. A method of assembling a power supply strip comprising:
    forming a plurality of conductor rails within a housing by, for each conductor rail:
        forming a generally V-shaped valley in a conductive resilient material, the V-shaped valley comprising a coating of a conductive material;
        surrounding the conductive resilient material on at least three sides by an insulator; and
    connecting a power receptacle module comprising at least one power receptacle to one or more of the plurality of conductor rails within the housing.

17. The method of claim 16, wherein the power receptacle module comprises three power receptacles and connecting the power receptacle module to one or more of the plurality of conductor rails comprises:
    connecting a first connection pin, a second connection pin, and a third connection pin of a first power receptacle of the three power receptacles to a rail of the plurality of rails associated with A-phase power, a rail of the plurality of rails associated with Neutral, and a rail of the plurality of rails associated with Ground, respectively;
    connecting a first connection pin, a second connection pin, and a third connection pin of a second power receptacle of the three power receptacles to a rail of the plurality of rails associated with B-phase power, the rail of the plurality of rails associated with Neutral, and the rail of the plurality of rails associated with Ground, respectively;
    connecting a first connection pin, a second connection pin, and a third connection pin of a third power receptacle of the three power receptacles to a rail of the plurality of rails associated with C-phase power, the rail of the plurality of rails associated with Neutral, and the rail of the plurality of rails associated with Ground, respectively.

18. A method of assembling a power supply strip for electronic equipment comprising:
    selecting a power receptacle module comprising at least one power receptacle based on one or more parameters associated with a piece of electronic equipment's power requirement;
    connecting the power receptacle module to one or more of a plurality of conductor rails within a housing, each conductor rail of the plurality of conductor rails comprising a generally V-shaped valley in a conductive resilient material, the valley comprising coating of a conductive material and the conductive resilient material being surrounded on at least three sides by an insulator.

19. The method of claim 18 wherein the one or more parameters associated with the piece of electronic equipment's power requirement are selected from the group consisting of voltage rating and amp rating.

* * * * *